(12) United States Patent
Vashchenko et al.

(10) Patent No.: US 7,056,761 B1
(45) Date of Patent: Jun. 6, 2006

(54) AVALANCHE DIODE WITH BREAKDOWN VOLTAGE CONTROLLED BY GATE LENGTH

(75) Inventors: Vladislav Vashchenko, Palo Alto, CA (US); Ann Concannon, San Jose, CA (US); Peter J. Hoppet, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/388,815

(22) Filed: Mar. 14, 2003

(51) Int. Cl.
*H01L 21/00* (2006.01)
*H01L 21/20* (2006.01)

(52) U.S. Cl. .................. 438/91; 438/380; 438/979; 438/983

(58) Field of Classification Search ............... 257/510, 257/103, 105, 106, 199, 481, 551, 603, 605, 257/606; 438/91, 199, 380, 570, 979, 983
See application file for complete search history.

(56) References Cited

U.S. PATENT DOCUMENTS 5,691,558 A * 11/1997 Davies ..................... 257/367

* cited by examiner

*Primary Examiner*—Steven Loke
(74) *Attorney, Agent, or Firm*—Jurgen Vollrath

(57) ABSTRACT

In an avalanche structure, different breakdown voltages are achieved by making use of a polygate and forming a highly doped p-n junction beneath the polygate, and adjusting the gate length and optionally the bias voltage of the gate.

7 Claims, 2 Drawing Sheets

US 7,056,761 B1

AVALANCHE DIODE WITH BREAKDOWN VOLTAGE CONTROLLED BY GATE LENGTH

BACKGROUND OF THE INVENTION

Avalanche diodes, which are sometimes loosely referred to as Zener diodes are commonly used for providing a reference voltages for analog circuits. One particular application is as part of an ESD protection clamp.

An important consideration in designing semiconductor circuits, however, is the need to avoid introducing special process steps that would increase the overall cost. Thus it is desirable to be able to include so-called free structures by making use of existing process steps. In a CMOS process, however, only limited variations can be made to available regions in order to form diodes. For instance, diodes can be created using n+/p-well, p+/n-well, p-well/n-well, and, to some extent, n+/p+ junctions by spacing the n+ and p+ regions far apart to avoid tunneling. In a 0.18 um process these combinations typically provide breakdown voltages of approximately 12V, 12V, 17V, and 4V, respectively. As a result avalanche diodes are available only with discrete breakdown voltage values.

In the case of power supply electrostatic discharge protection (ESD) clamps, breakdown voltages in the range of about 5V–10V are, however, required. Conventional diodes thus fail to provide the requisite breakdown voltages.

One proposed prior art solution is to make use of n+/p+ as the diode and make use of a blocked space such as a shallow trench isolation region (STI) 100 between the n+ region 102 and p+ region 104 as shown in FIG. 1. However, this is usually not possible, especially in the case of small dimension devices, due to inadequate tolerance in the mask alignment.

The present invention seeks to address the problem of providing suitable breakdown voltages for avalanche diodes without adding additional process steps to the CMOS process.

SUMMARY OF THE INVENTION

The present invention comprises an avalanche diode structure, wherein the structure is adjustable to provide for a wide range of breakdown voltages. In particular, by adjusting the blocking junction, different breakdown voltages can be realized. This is achieved by forming n+ and p+ regions and making use of a polygate in a CMOS process to form an abrupt junction. The gate can, further, be provided with a contact and its voltage adjusted. For instance, the gate can be connected to the cathode or anode or to an external bias circuit to adjust the breakdown voltage.

Thus, according to the invention, there is provided an avalanche diode structure comprising a p+ and a n+ region under a polysilicon region. For ease of description, the polysilicon region will be referred to as a polygate since it is formed in a CMOS process in the same way as any other polygate would be formed. However, the polygate of the present diode structure need not necessarily be provided with a contact.

The p+ and n+ regions are typically formed in lightly doped regions, referred to as PLDD (p-lightly doped region) and NLDD (n-lightly doped region), respectively.

Further, according to the invention, there is provided a method of forming an avalanche diode, comprising providing a polygate and using the polygate as a self aligned mask during doping of the p-n junction of the diode. The masks for the oppositely doped regions of the junction are preferably positioned so as to overlap with the polygate. Preferably the doping of the p-n junction comprises forming n+ and p+ regions in corresponding lightly doped regions. The lightly doped regions are preferably formed during a high voltage portion of the CMOS process. The method may include adjusting the gate length.

The invention, further, provides for adjustment of the breakdown voltage of an avalanche diode of the invention by suitably biasing the polygate. The gate may be connected to either the anode or the cathode of the diode structure, or may be connected to a driver circuit that biases the polygate to provide dynamic breakdown voltage control.

DETAILED DESCRIPTION OF THE INVENTION

Figure 1:
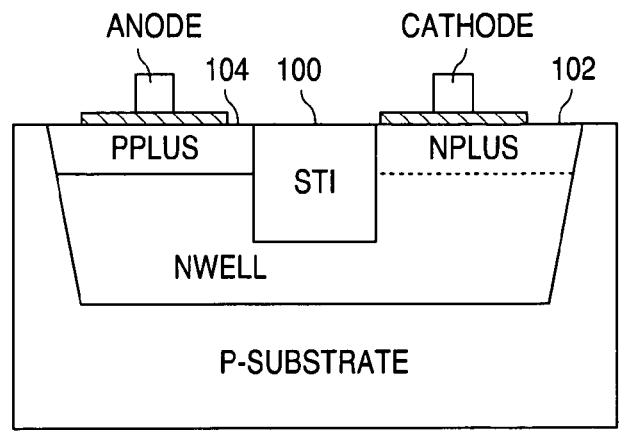
FIG. 1 shows a cross section through a prior art avalanche diode.
Figure 2:
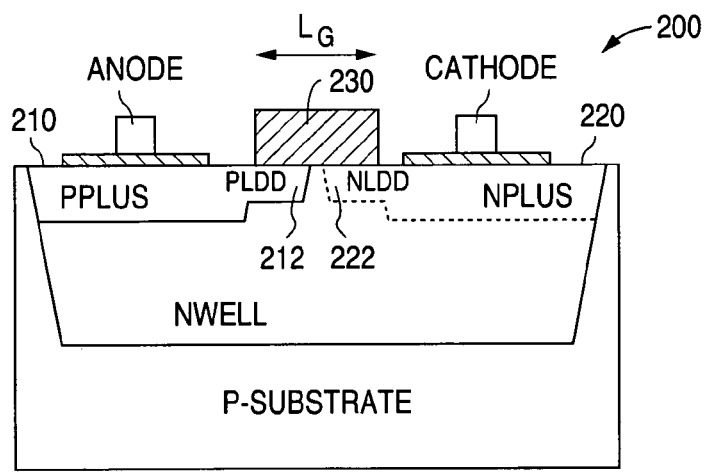
FIG. 2 shows a cross section through one embodiment of the invention.

One embodiment of the invention is shown in FIG. 2 which shows the p-n junction of the diode 200 formed between a p+ region 210 formed in a lightly doped region 212 referred to as a p-lightly doped drain (PLDD), and a n+ region 220 formed in a lightly doped region 222 referred to as a n-lightly doped drain (NLDD).

The need for the PLDD and NLDD regions 212, 222 can be ascribed to the CMOS process. In order to avoid contamination across the junction during the high doping process, the formation of the p+ and n+ regions 210, 220 is typically preceded by the formation of lightly doped regions, referred to as PLDD (p-lightly doped region) and NLDD (n-lightly doped region), respectively.

As is evident from FIG. 2, a polygate 230 is formed over the region where the p-n junction will be located. The polygate 230 has a self aligning mask function. Even though separate masks are used during the doping of the p+ and PLDD and n+ and NLDD regions, it becomes difficult to properly align them, especially at small dimensions. By making use of the polygate as a mask, the exact alignment of the masks is no longer critical. The masks for the oppositely doped regions (not shown) applied to the opposite sides of the polygate 230, are preferably positioned so as to overlap with the polygate 230, using the polygate 230 as a mask that provides a certain amount of self-alignment.

In one embodiment the lightly doped regions, PLDD 212 and NLDD 222 are formed during a high voltage portion of the CMOS process to provide for greater flexibility in achieving the desired breakdown voltage. A typical semiconductor circuit may include a core and an I/O structure. These two portions typically operate at different voltages. The core typically operates at a lower voltage dictated by the process, e.g. for a 0.18 μm process the voltage is 1.8V±10%, while the I/O structure may operate at a higher voltage of 3.3V or 5V. For a 0.25 μm process the core voltage is 2.5V±10%, while the I/O voltage will again be at a higher voltage of 3.3V or 5V. These different portions will be implemented by varying the process steps in order to accommodate the low and high voltage levels, respectively. For instance, in the case of a high voltage structure, the gate oxide has to be thicker and is typically implemented by making use of a dual or triple oxide. For example in the case of a 0.18 µm process, the gate oxide for the low voltage part has a length of 0.18 µm and a thickness of 30 Å, while the gate oxide for the high voltage part has a length of 0.35–0.4 µm and a thickness of 70 Å. Also, the doped regions will be adapted to the different operating voltage. During a high voltage process, more dopant extends under the gate from either side of the gate 230. Thus, for example in a 0.18 µm process, a junction width between the p+ and n+ regions 210, 220 of approximately 0.15 µm is achieved even with a polygate length of 0.35 um. In contrast, for a low voltage implantation in a 0.18 µm process the junction width will remain rather large (approximately 0.1 µm) even with a polygate length of only 0.18 µm.

Thus by reducing the length of the polygate in a high voltage process, smaller distances and even overlaps between the PLDD and NLDD can be achieved.

This provides an abrupt junction with minimum breakdown voltage of approximately 5V in a 0.18 um process. On the other hand, the gate length can be increased to provide for a more gradual doping distribution near the p-n junction region. This allows the breakdown voltage to be increased up to the well-to-well breakdown voltage level. Thus, the invention provides an avalanche diode structure for which the breakdown voltage can be adjusted in relation to the polygate length. In other embodiments, the PLDD and NLDD regions were formed during a high voltage portion of the process, while the polygate was formed during a low voltage portion of the process. Other embodiments formed some of the doped regions (n+, p+, NLDD, PLDD, n-well, p-well) during a high voltage portion of the process and others during a low voltage portion. Thus, for example the PLDD may have been formed during a low voltage portion of the process, while the NLDD was formed during a high voltage portion of the process.

Figure 4:
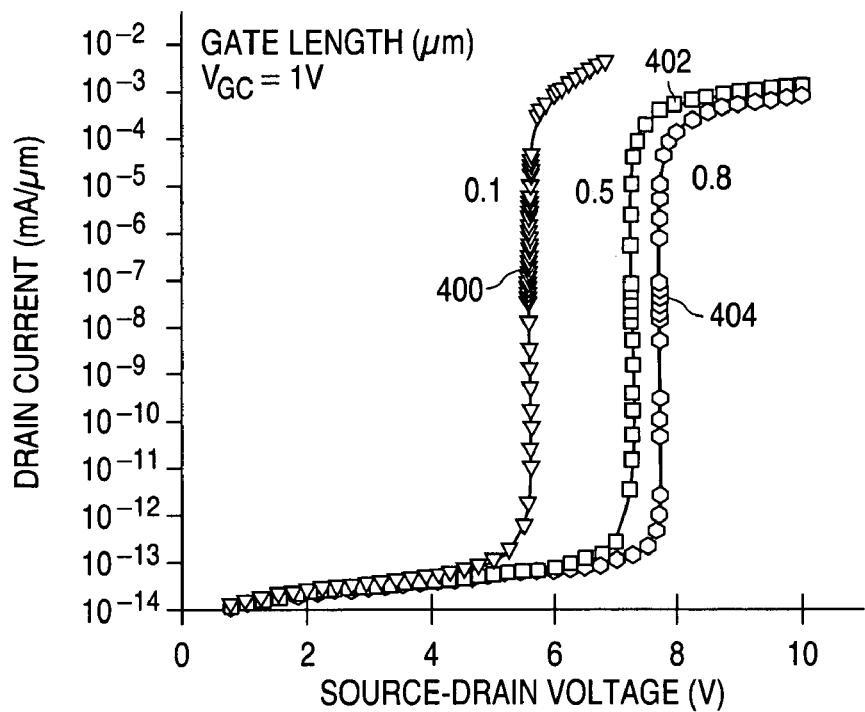
FIG. 4 shows graphs of drain current against source-drain voltage for different gate lengths.

The effect of gate length changes is illustrated by the graphs of FIG. 4, which show TCAD analyses for different gate lengths for diodes of the invention. In particular, FIG. 4 shows curves of drain current against source-drain voltage for different gate lengths, while biasing the gate to a voltage of 1V. Curve 400 shows the current voltage curves for a 0.1 µm gate length, curve 402 shows the curves at a polygate length of 0.5 µm, and curve 404 shows the curve for a polygate length of 0.8 µm. Thus, it is clear that the breakdown voltage can be reduced by reducing the polygate length of the diode. For instance, in the embodiment of FIG. 2, the polygate length is reduced or increased to provide for breakdown voltages as low as approximately 5V.

Figure 3:
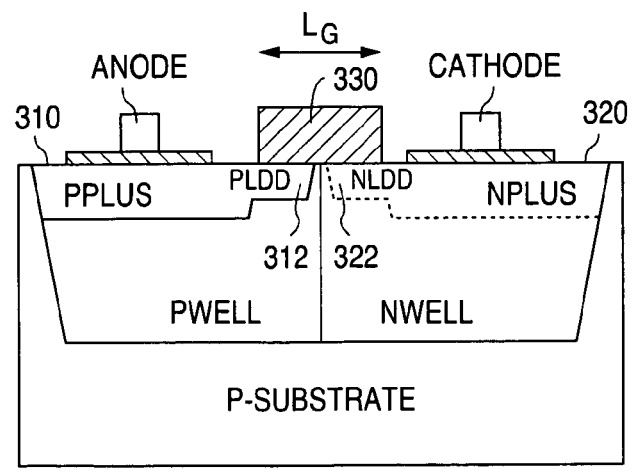
FIG. 3 shows a cross section through another embodiment of the invention.

Another embodiment of the invention is shown in FIG. 3 which shows the p+ region 310 and PLDD 312 formed in a p-well 340, while the n+ region 320 and NLDD 322 are formed in a n-well 350. In this embodiment the junction between the p-well 340 and n-well 350 is located under the polygate 330. However the junction could be shifted to the left or the right. Thus the FIG. 2 embodiment can be seen as the extreme case where the junction has been moved all the way to the left so that the n-well covers both the cathode and the anode regions, and the p-well is eliminated altogether. Simulation results show that increasing the gate length of the polygate 330 allows breakdown voltages of up to the well to well breakdown voltage to be achieved. It will be appreciated that where the p-well is eliminated altogether the upper limit to the breakdown voltage will be the breakdown voltage of the PLDD-n-well junction. Below some critical gate length the breakdown voltage will essentially be a function of the polygate length. As mentioned above, reducing the polygate length allows breakdown voltages to be reduced to approximately 5V.

The invention, further, provides for adjustment of the breakdown voltage by suitably biasing the polygate. In one embodiment the gate is connected to either the anode or the cathode of the diode structure to act as a field electrode. This allows the breakdown voltage to be further decreased or increased.

In another embodiment the polygate is connected to a driver circuit that biases the polygate to provide dynamic breakdown voltage control. This, in turn, allows the triggering of the diode to be controlled.

Figure 5:
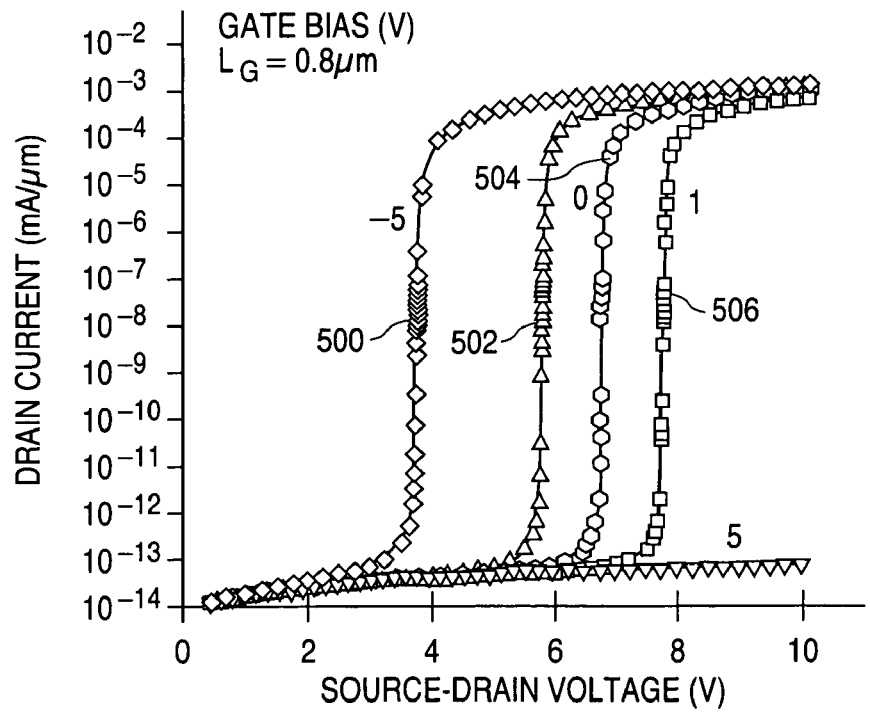
FIG. 5 shows graphs of drain current against source-drain voltage for different gate bias.

The effect of changing the gate bias on the breakdown voltage is shown in FIG. 5. FIG. 5 shows TCAD analyses of different devices of the present invention, showing the effect of changing the polygate bias. Curves 500–506 show drain current against source-drain voltage curves for a gate length of 0.8 µm. In curve 500 the polygate is biased to a voltage of −5V; in curve 502 the gate bias is −1V; in curve 504 the gate bias is 0V, and in curve 506 the gate bias is 1V. Thus, it can be seen that the breakdown voltage can be increased by increasing the bias of the gate.

While the invention has been described with respect to a few specific embodiments, it will be appreciated that different configurations could be provided without departing from the scope of the invention.

What is claimed is:

1. A method of providing an avalanche diode of selectable breakdown voltage, comprising forming a polygate on a semiconductor substrate or well, and forming a p+ region and a n+ region in the substrate or well using the polygate as a mask during doping of the p+ region and n+ region, wherein the p+region is formed in a p-lightly doped drain region and the n+region is formed in a n-lightly doped drain region.

2. A method of claim 1, wherein forming the p-lightly doped drain region and n-lightly doped drain region includes using the polygate as a mask during doping of the p-lightly doped drain region and n-lightly doped drain region.

3. A method of claim 2, wherein p-lightly doped drain region and n-lightly doped drain region are formed in at least one well region.

4. A method of claim 3, wherein the p-lightly doped drain region and n-lightly doped drain region are formed in a n-well.

5. A method of claim 3, wherein the p-lightly doped drain region is formed in a p-well and the n-lightly doped drain region is formed in a n-well.

6. A method of claim 3, further comprising adjusting the length of the polygate to achieve the desired breakdown voltage for the diode.

7. A method of claim 1, further comprising adjusting the length of the polygate to achieve the desired breakdown voltage for the diode.

* * * * *